United States Patent [19]

Tamaki et al.

[11] Patent Number: 4,465,373

[45] Date of Patent: Aug. 14, 1984

[54] ENCODER

[75] Inventors: Hiroshi Tamaki, Tokyo; Fumio Ohtomo, Kawagoe; Kazuaki Kimura, Tokyo, all of Japan

[73] Assignee: Tokyo Kogaku Kikai Kabushiki Kaisha, Tokyo, Japan

[21] Appl. No.: 273,772

[22] Filed: Jun. 15, 1981

[30] Foreign Application Priority Data

Jun. 17, 1980 [JP] Japan .................................. 55-81697

[51] Int. Cl.³ .......................... G01B 11/00; G01D 5/36
[52] U.S. Cl. ................................. 356/374; 33/125 C; 250/237 G
[58] Field of Search .............................. 356/373, 374; 250/237 G; 33/125 A, 125 C, 1 M

[56] References Cited

U.S. PATENT DOCUMENTS

| | | | |
|---|---|---|---|
| 3,500,055 | 3/1970 | Russell et al. | 356/373 |
| 3,648,276 | 3/1972 | Schuman | 33/125 A |
| 3,708,681 | 1/1973 | Ivers | 250/237 G |
| 3,748,043 | 7/1973 | Zipin | 250/237 G |
| 4,180,703 | 12/1979 | Cialone et al. | 250/237 G |
| 4,253,021 | 2/1981 | Ernst | 250/237 G |

FOREIGN PATENT DOCUMENTS

| | | | |
|---|---|---|---|
| 0013799 | 8/1980 | European Pat. Off. | 33/125 C |
| 1915478 | 10/1969 | Fed. Rep. of Germany | 250/237 G |
| 1192513 | 5/1970 | United Kingdom | 33/125 C |

*Primary Examiner*—R. A. Rosenberger
*Attorney, Agent, or Firm*—Oblon, Fisher, Spivak, McClelland & Maier

[57] ABSTRACT

An interpolation encoder comprising a sensor array, a code plate arranged in opposition to the sensor array and having a plurality of groups of lattice patterns, and an arithmetic unit for processing data of the code plate detected by the sensor array. The lattice patterns of at least one of the groups are inclined.

21 Claims, 17 Drawing Figures

ENCODER

The present invention relates to an encoder for measuring distances or angles and, more particularly, to an encoder which is capable of providing high precision and good resolution.

As conventional encoders, linear encoders and rotary encoders are known. The linear encoder is used to measure distances, and the rotary encoder is used to measure angles. These two types of encoders are based on essentially the same principle, and differ from each other only according to whether the encoder arrangement is linear or circular. The encoders are also classified into optical encoders which utilize light, encoders which utilize magnetism or electromagnetism instead of light, and so on.

In the field of measurement of distances or angles, division of the calibration unit for measurement is generally restricted by the manufacturing limits of the scale. Therefore, the minimum measurable limit is determined by the size of the calibration unit. For obtaining measurements of a smaller magnitude than the measurable limit, interpolation within the minimum calibration unit is required.

Various methods have been proposed for this purpose. As one such method, in the case of an optical encoder, there is known a method according to which two sensors are incorporated for reading the data of optical lattice patterns corresponding to a scale on a code plate. In this case, each of these sensors reads data having a phase difference of ¼ pitch, that is, a phase angle of 90° of the code plate, and the reading output signals of these two sensors are processed for interpolating within the minimum calibration unit of the lattice patterns of the code plate. As the interpolation method in such a case, methods to be described below are known. The first example is the zero point reference interpolation method according to which square pulses are formed from two sinusoidal signals of different phases read out from the code plate using as a reference the crossing point of zero potential, and the leading edges and the trailing edges of the square pulses of two pulse sequences are counted to thereby interpolate within one period of the lattice pattern.

However, although a high measuring precision may be obtained by this interpolation method, it is limited to ¼ pitch of the lattice patterns. Although it has been proposed to use signals having a phase difference of other than 90° in order to solve this problem, this necessarily results in a complex signal processing circuit. A high precision which warrants the complexity is not easily obtainable.

European patent application No. 13799 describes a rotary encoder which has a code plate wherein a plurality of pattern blocks are arranged in a row, each block having in rows at least mark data representing the block, lattice pattern data with repeated "1" and "0" data, and address data; a sensor array of a plurality of sensor elements arranged in a row for reading data on at least one block of the code plate, the sensor array being arranged patallel to the code plate in the direction of relative displacement therewith; and a circuit for processing electric output signals from the sensor array. The sensor array is so constructed to have a different number of sensor elements from the number of data of the lattice pattern within one block, thereby establishing a vernier relationship between the lattice patterns and the group of sensor elements. In this manner, the absolute position or angle to one pitch unit of the sensor array is obtained from the mark data and the address data time-serially output from the sensor array, and a reading within one pitch unit of the sensor element may be interpolated and read from the electric output signals time-serially output from the sensor array in correspondence with the lattice patterns.

However, this type of encoder still has the defects to be described below:

(1) In a rotary encoder for measuring angles comprising a circular code plate arranging a plurality of blocks along the circumference and a linear sensor array arranged parallel to the tangential direction of the circular code plate for reading data from the code plate, the address data, the mark data, and the lattice pattern arranged in arc shapes are read by the linearly arranged plurality of sensor elements. For this reason, a correction arithmetic unit is required for correcting the obtained reading into a reading corresponding of the case wherein the address data, the mark data, and the lattice pattern are linearly arranged.

(2) In a linear encoder for measuring a relative displacement along the longitudinal directions of the linear code plate and sensor array, when the relative displacement is rapid, the reading of the lattice patterns and the address data becomes difficult.

(3) In a case wherein a conventional linear encoder is used in a device which reads displacements or coordinates in two-dimensions, two sets of linear encoders must be used, one for reading the displacement in the X direction or the X coordinate, and the other for reading the displacement in the Y direction or the Y coordinate, resulting in a higher manufacturing cost.

In order to solve these problems of conventional encoders, it is an object of the present invention to provide an interpolation encoder wherein a code plate is arranged in opposition to a sensor array having a plurality of sensor elements, and the number of lattice patterns within a predetermined length of the code plate is different from the number of the sensor elements corresponding to the predetermined length, characterized in that a group of inclined lattice patterns are formed in the code plate as inclined with respect to the direction of arrangement of the sensor elements of the sensor array, thereby establishing interpolation with high precision.

It is another object of the present invention to provide an encoder wherein the code plate has at least two groups of lattice patterns and at least one of them is a group of inclined lattice patterns so that displacement of the code place in the longitudinal direction of the sensor array and in the direction perpendicular thereto may be detected independently with high precision.

It is a further object of the present invention to provide an encoder wherein the code plate has at least two symmetrical groups of inclined lattice patterns about a line along the direction of relative displacement of the code plate and the sensor array so that errors in the relative positions of the code plate and the sensor array in the direction perpendicular to the direction of normal displacement may be cancelled.

It is a further object of the present invention to provide a rotary encoder which is capable of measuring angles with high precision by forming a group of inclined lattice patterns of a code plate in an Archimedes' spiral pattern.

It is a further object of the present invention to provide an encoder having a code plate with a plurality of blocks in the direction of its normal displacement, a sensor array having a plurality of sensor elements arranged in a direction different from the direction of normal displacement of the code plate for detecting the data of the code plate, and an arithmetic unit for processing the data of the code plate detected by the sensor array, wherein each block of the code plate consists of at least address data representing the address of each block and interpolating patterns which are different in number from the sensor elements of the sensor array within a predetermined distance and which vary in the direction different from the direction of normal displacement of the code plate, thereby allowing measurements with high precision.

It is a further object of the present invention to provide an encoder wherein fine reading patterns varying in a direction which is different from the direction of normal displacement of a code plate for reading fine displacements within a block, taking the width of a sensor element constituting a sensor array as a unit, are formed in each block of the code plate, thereby allowing measurements with high precision.

It is a further object of the present invention to provide an encoder having a code plate with a plurality of blocks in the direction of its normal displacement, a sensor array having a plurality of sensor elements arranged in a direction different from the direction of normal displacement of the code plate for detecting the data of the code plate, and an arithmetic unit for processing the data of the code plate detected by the sensor array, wherein the code plate has fine reading patterns varying in the direction different from the direction of normal displacement of the code plate, and interpolation patterns which are different in number from the sensor elements of the sensor array within a corresponding predetermined distance; means is incorporated for incrementally reading from the fine reading patterns a relative displacement with a unit of a block by detecting the fine reading pattern with a particular sensor element of the sensor array; and means is incorporated for taking a fine reading from the fine reading patterns within one block, using the width of a sensor element of the sensor array as a unit, thereby interpolating with high precision within one element unit of the sensor element from the interpolation patterns.

This invention can be more fully understood from the following detailed description when taken in conjunction with the accompanying drawings, in which:

FIG. 1 is a schematic view of a detecting part according to a first embodiment of the present invention;

FIGS. 2(a) and 2(b) are views for explaining the principle of the interpolation reading performed with the encoder according to the first embodiment of the present invention, respectively;

FIGS. 3(a), 3(b) and 3(c) are views showing the outputs of a line sensor in FIG. 2(b), respectively;

FIGS. 4(a) through 4(h) are views showing the arrangement of inclined patterns of a code plate and intersections of the outputs of the line sensor according to the first embodiment of the present invention, respectively;

FIGS. 5(a) and 5(b) are views showing in detail the code pattern of the code plate and the corresponding input and output signals of the line sensor according to the first embodiment of the present invention, respectively;

The preferred embodiments of the present invention will now be described in detail with reference to the accompanying drawings.

Figure 1:
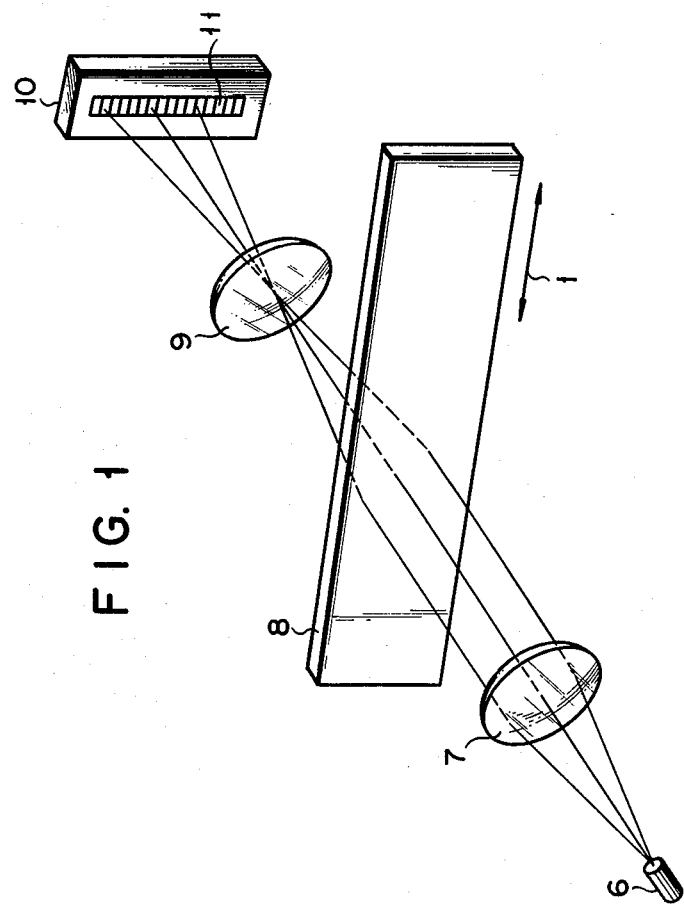
Figure 2B:
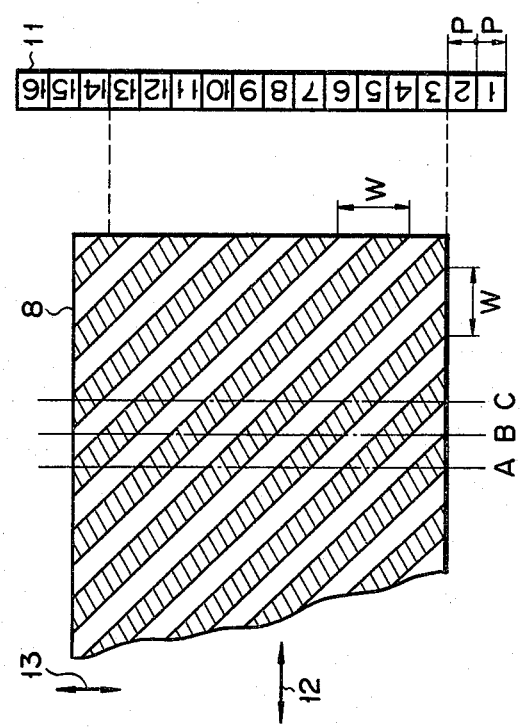
Figure 2A:
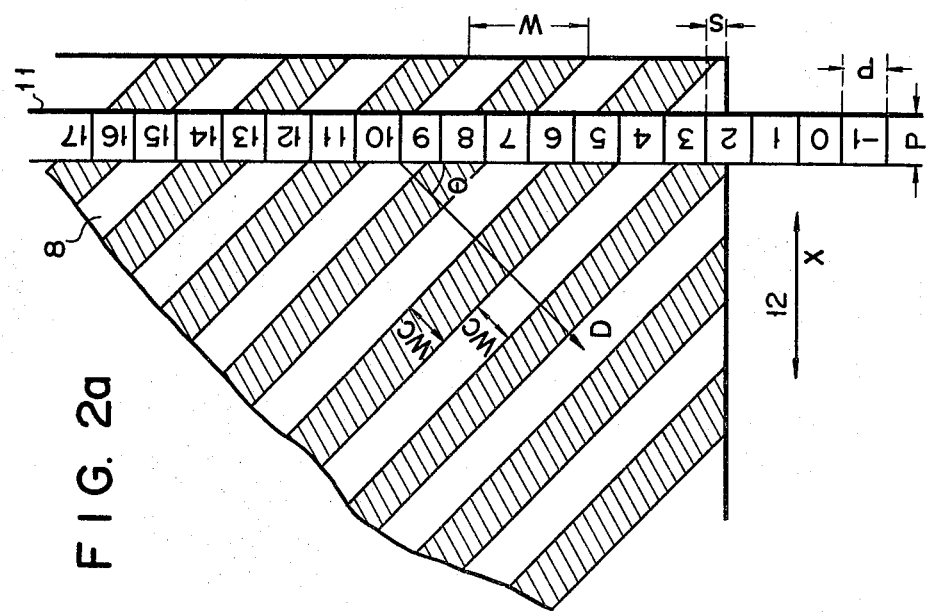

Referring to FIG. 1, a code plate 8 mounted to a displacement table or the like (not shown) is irradiated with light emitted from a light source 6 through an illumination lens 7, and the transmitted image is formed on a sensor array 11 of a line sensor 10 by a projection lens 9 to obtain an image. The line sensor 10 comprises the sensor array 11 having sensor array elements of independent sensitivities arranged in an array, and it outputs signals corresponding to the image in synchronism with clock pulses. FIGS. 2(a) and 2(b) show the detailed arrangement of the code plate 8 and the sensor array 11 used in FIG. 1. A regular lattice of white and black (transparent and opaque) slits is arranged at an inclination of 45° with respect to the sensor array 11. When a difference is maintained between the period of the slits of the code plate 8 and the repeating period of every other element of the sensor array 11, a vernier relationship is established between the lattice patterns of the code plate 8 and the sensor array 11 so that the output of the sensor array 11 includes periodic beats. This will be described in more detail. Referring to FIG. 2(a), when the pitch of the regular lattice is 2Wc, the width of individual sensor elements, for example, photoelectric conversion elements arranged on the line sensor is P, and the electric signal T(p,q) appears at a particular element (e.g., Pth element) when the image of the regular lattice is formed on the line sensor, this electric signal T(p,q) may be expressed by the following equation:

$$T(p,q) = \alpha P^2 \left[ 1 + \frac{16}{\pi^3 M^2 \cos\theta \sin\theta} \sum_{k=0}^{\infty} \frac{H(2k+1)}{(2k+1)^3} \times \right.$$
$$\sin\frac{(2k+1)\pi M\cos\theta}{2} \sin\frac{(2k+1)\pi M\sin\theta}{2} \times$$
$$\left. \sin\frac{(2k+1)\pi M\cos\theta}{2} \{2(p+q) - \tan\theta - 1\} \right]$$

where:
$\alpha$ is a constant of photoelectric conversion,
$M = P/Wc$, and
q is a dimensionless term related to the relative displacement of the regular lattice and the line sensor.
When the relative phase difference S between the regular lattice and the line sensor is expressed as $S < P$, $$q = \frac{S}{P}$$

Therefore, when the regular lattice and the line sensor move relative to each other in the direction indicated by arrow 12, the relation between S and displacement x may be expressed as $S/x = \tan\theta$ where $\theta$ is the intersecting angle of the line sensor with the direction D of arrangement of the regular lattice.

The relation between the relative displacement x of the regular lattice and the line sensor and the dimensionless phase difference q is expressed as:

$$q = \frac{x}{P} \tan \theta$$

When $\theta = 45°$, q represents the actual displacement taking as a unit the width P of the individual photo-electric conversion elements arranged on the line sensor.

Figure 3:
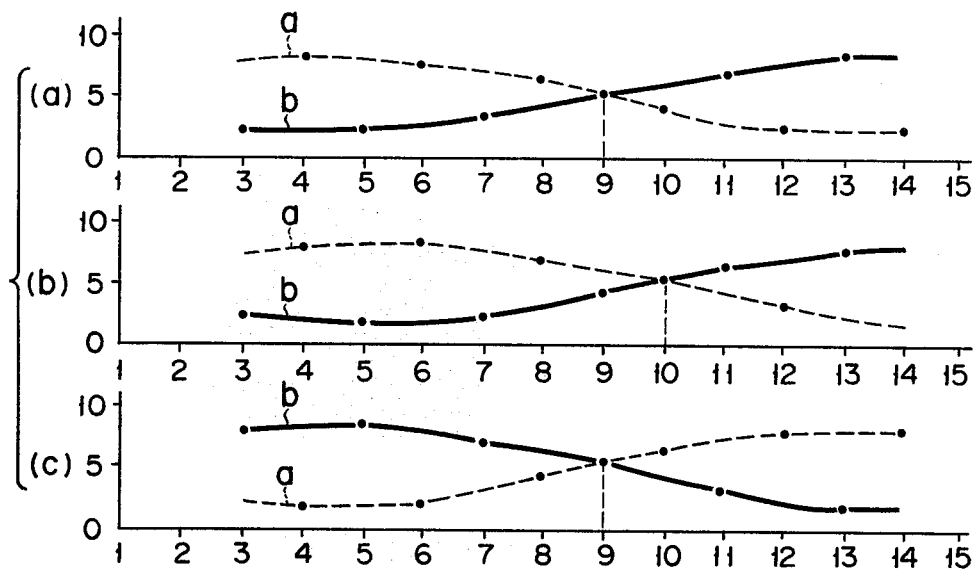

The vernier relationship will now be described in further detail with reference to FIG. 2(b). In FIG. 2(b), a period W in the direction of normal displacement of the lattice indicated by arrows 12, 13 and a period 2P of every other element of the sensor, hold a vernier relationship of $10W = 11 \times 2P$ (that is, a ratio of 10 : 11). Therefore, the output of every other element of the sensor array 11 shows beats with a period of 22 elements on the sensor array 11. FIG. 3(a) shows the relationship between output b at every other element from the third element (output at the odd-number elements) of the sensor array 11 with an output a at every other element from the fourth element (output of even-numbered elements) when the relative positions of the code plate 8 and the sensor array 11 is as shown at A of FIG. 2(b). FIG. 3(b) shows the condition when the position of the sensor array 11 with repeat to the code plate 8 is shifted to the right by 1/22·W in FIG. 2(b). It is seen from this figure that the intersection of the output a with the output b is shifted by one element on the sensor array 11. In this manner, according to the relative displacement of the code plate 8 and the sensor array 11, the intersection of the output of the odd-numbered elements of the sensor array 11 with the output of the even-numbered elements is shifted. When the relative displacement becomes W/2 (relationship as shown by B of FIG. 2(b)), the position of the intersection is at the same line sensor element as in FIG. 3(a), as shown in FIG. 3(c). However, at this instant, the output of the odd-numbered elements and the output of the even-numbered elements are inverted with respect to the case of FIG. 3(a). When the code plate 8 and the sensor 11 move further by W/2 and are placed under the condition as shown by C of FIG. 2(b), the output of the sensor array 11 becomes as shown in FIG. 3(a). Therefore, the ½ period of the code plate 8, that is, W/2 may be interpolated with sufficient resolution when taking the position of the intersection alone into consideration. One period of the code plate 8 may also be interpolated with sufficient resolution by taking into consideration the position of the intersection and the phase conditions of the output of the odd-numbered elements and the output of even-numbered elements.

Along the axis of ordinates of FIGS. 3(a), 3(b) and 3(c) are plotted "10" representing the total irradiation of one element of the sensor array 11, and "0" representing the complete masking of the element. Due to the fact that the lattice is inclined with respect to the sensor array 11, the maximum level of the output is "8" and the minimum level is about "2", resulting in a reduction in contrast. However, this is negligible in practice. When the slits are inclined with respect to the sensor array 11, interpolation in the direction perpendicular to the longitudinal direction of the sensor array 11 may be performed. Similarly, interpolation may be performed in the longitudinal direction of the sensor array as in the case of the encoder as disclosed in European patent application No. 13799 described hereinbefore.

When the lattice is projected on the sensor array 11 as inclined with respect thereto, the sensitivities are obtained in both of the directions indicated by the arrows 12 and 13 shown in FIG. 2(b) during the relative displacement of the code plate 8 and the sensor array 11. This is the distintive feature of the present invention which is not contemplated in the invention disclosed in European patent application No. 13799. Referring to FIG. 2(b), when the lattice has an angle of inclination of 45° with respect to the sensor array 11, equal sensitivities may be obtained for displacement in either direction as indicated by 12 and 13. When the angle of inclination of the lattice with respect to the longitudinal direction of the sensor array 11 is less than 45°, the sensitivity for displacement in the direction indicated by 12 becomes greater than that for displacement in the direction indicated by 13. When the case is the reverse, the sensitivity for displacement in the direction indicated by 13 becomes greater. Thus, the present invention is advantageous in that the detection sensitivity for displacement may be arbitrarily set by changing the angle of inclination within the range wherein the contrast of the output waveform is sufficient.

In the embodiment shown in FIG. 2(b), since both the displacement in the direction indicated by the arrow 12 and the displacement in the direction indicated by the arrow 13 are detected as a change in the position of the intersection of the outputs of the even-numbered elements and the odd-numbered elements (intersection of the sensor array output waveforms generated by the vernier relationship effect will simply be referred to as the intersection for brevity hereinafter), they must be separated by some method.

Figure 4A:
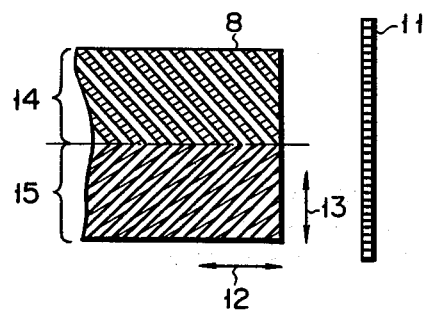

An example of the separation method for this purpose will be described referring to FIGS. 4(a) and 4(b). In FIG. 4(a), a track 14 with inclined slits is arranged with another track 15 having slits which are symmetrical with the slits of the track 14. Reference numeral 11 denotes the corresponding sensor array. Referring to FIG. 4(a), when the code plate 8 and the sensor array 11 move relative to each other in the direction denoted by arrow 12, the intersections of the output of the sensor array 11 with the lattice pattern of the track 14 and the output of the sensor array 11 with the lattice pattern of the track 15 are shifted in opposite directions on the sensor array according to the distance of displacement. This is shown in FIG. 4(c).

Figure 4B:
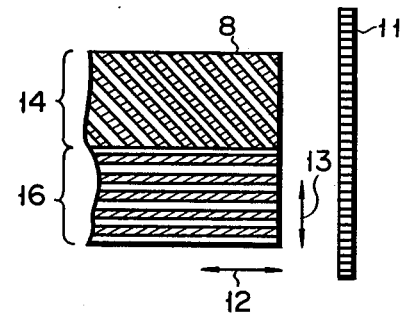
Figure 4C:
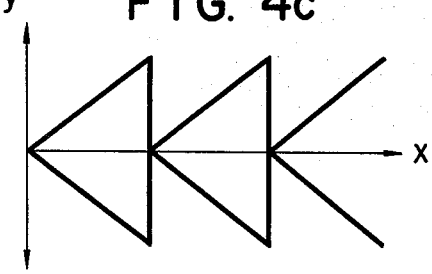

In FIG. 4(c), the Y-axis represents the position of the intersection on the sensor array, and the X-axis represents the distance of displacement in the direction of arrow 12 in FIG. 4(a). In FIG. 4(c), the loci of the intersections of the track 14 of FIG. 4(a) are shown in the upper half, and the loci of the intersections of the track 15 of FIG. 4(a) are shown in the lower half.

Figure 4D:
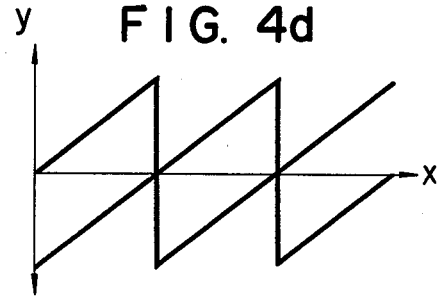

FIG. 4(d) shows the loci of the intersections when the relative displacement is made in the direction of arrow 13 of FIG. 4(a); the loci are shown in the same manner as in FIG. 4(c).

As for the period of the loci of the intersections in FIGS. 4(c) and 4(d), as has been described hereinbefore, the displacement which is half the period of the white and black lattice patterns is 1 period when only the intersections of the even-numbered output and the odd-numbered output of the sensor array are considered. When the positions of the intersections and the phase relationship between the even-numbered elements and the odd-numbered elements are also considered, the displacement corresponding to the period W of the lattice is 1 period. As may be seen from the loci of the intersections shown in FIG. 4(c) and 4(d), by arranging the lattice as shown in FIG. 4(a), the displacement in the direction of arrow 12 may be separated and detected as the distance between the intersections on the sensor array by the inclined lattice pattern tracks 14 and 15, and the displacement in the direction of arrow 13 may be separated and detected as the displacement of the midpoint between the intersections. This arrangement is further advantageous in that the detection sensitivity for detection of displacement in the direction of arrow 12 may be doubled.

FIG. 4(b) shows another embodiment wherein a track 16 having white and black lattice patterns along the direction perpendicular to the longitudinal direction of the sensor array 11 is attached to the above-described inclined pattern track 14 in such a manner that a vernier relationship is established therebetween. In this case, since the intersections of the sensor array 11 are only sensitive to the relative displacement in the direction of arrow 13 shown in the figure, relative displacements in both directions indicated by arrows 12 and 13 may be separated by checking the displacement of the intersection with the track 14 and the displacement of the intersection with the track 16.

Figure 4G:
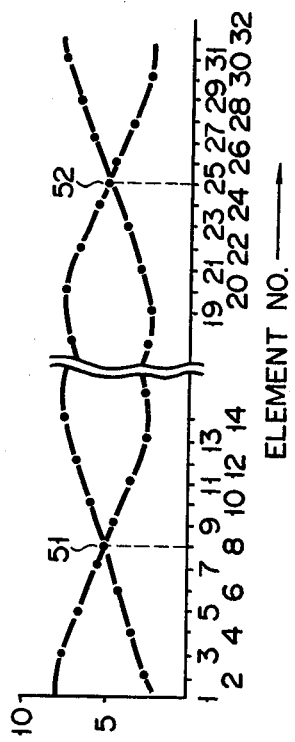
Figure 4H:
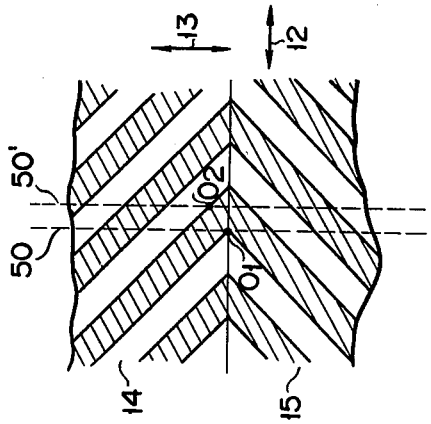
Figure 4F:
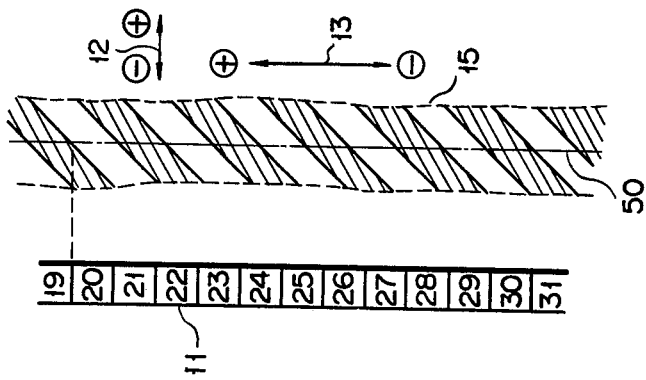
Figure 4E:
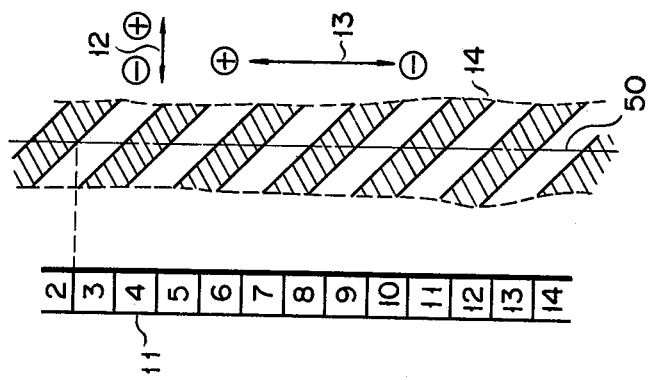

The above description will further be examined with reference to FIGS. 4(e) to 4(h). Referring to FIG. 4(h), the position of the sensor array with respect to the inclined lattice patterns of the tracks 14 and 15 is at a position 50 shown in this figure. If the relative positions of the track 14 and the sensor array 11 are as shown in FIG. 4(e) and the relative positions of the track 15 and the sensor array 11 are as shown in FIG. 4(f), the output of the sensor array 11 obtained by the vernier relationship at this instant becomes as shown in FIG. 4(g), and intersections 51 and 52 appear on an element 8 and an element 25 of the sensor array, respectively. If it is assumed that the size of one element of the sensor array is 10 $\mu$m $\times$ 10 $\mu$m and a vernier relationship of 10 : 11 is established between the group of inclined lattice patterns and the sensor array, the displacement of the intersection by a distance corresponding to one element indicates a displacement of the code plate of 1 $\mu$m as has been described hereinbefore. In FIG. 4(h), it is now assumed that the sensor array and the inclined lattice patterns have moved relative to each other simultaneously in the directions of arrows 12 and 13. Thus, the position of the sensor array has changed from 50 to 50', and the position of any point of the sensor array has changed from 01 to 02. For example, the displacement in the direction of arrow 12 is assumed to be 2 $\mu$m and the displacement in the direction of arrow 13 is assumed to be 3 $\mu$m. In this case, referring to FIG. 4(e), the code plate moves 3 $\mu$m in the $\ominus$ direction of the arrow 13, the intersection 51 moves to an element 5, the code plate moves 2 $\mu$m in the $\ominus$ direction of the arrow 13, and the intersection 51 thus also moves in the $\ominus$ direction to an element 3. In FIG. 4(f), when the code plate moves in the $\ominus$ direction of the arrow 13, the intersection 52 moves to an element 22. Further, opposite to the case of the intersection 51, when the code plate moves in the $\ominus$ direction of the arrow 12, the intersection 52 moves from the element 22 in the $\oplus$ direction to an element 24. Therefore, the two-dimensional displacements in the directions of the arrows 12 and 13 may be measured by detecting the positions of intersections obtained with the tracks 14 and 15. In this embodiment, since the intersection 51 moves from the element 8 to the element 3 and the intersection 52 moves from the element 25 to the element 24 upon relative displacement of the sensor array and the lattice patterns, the displacement in the direction indicated by 12 may be obtained as:

$$\left| \frac{(25-8)-(24-3)}{2} \right| = 2 \text{ elements} = 2 \ \mu\text{m}$$

and the displacement in the direction indicated by 13 may be obtained as:

$$\left| \frac{(25+8)}{2} - \frac{(24+3)}{2} \right| = 3 \text{ elements} = 3 \ \mu\text{m}$$

In the above description, the light transmitted through the code plate is detected by the line sensor. However, similar effects may be obtained with the reflected light. Furthermore, the lattice patterns on the code plate need not be binary data of white and black patterns but may be data of continuously gradating transmittance or reflectance. It, therefore, suffices that the lattice patterns which periodically change in transmittance or reflectance be formed on the code plate, establishing a vernier relationship between the period of such change and the corresponding elements of the line sensor.

Figure 5A:
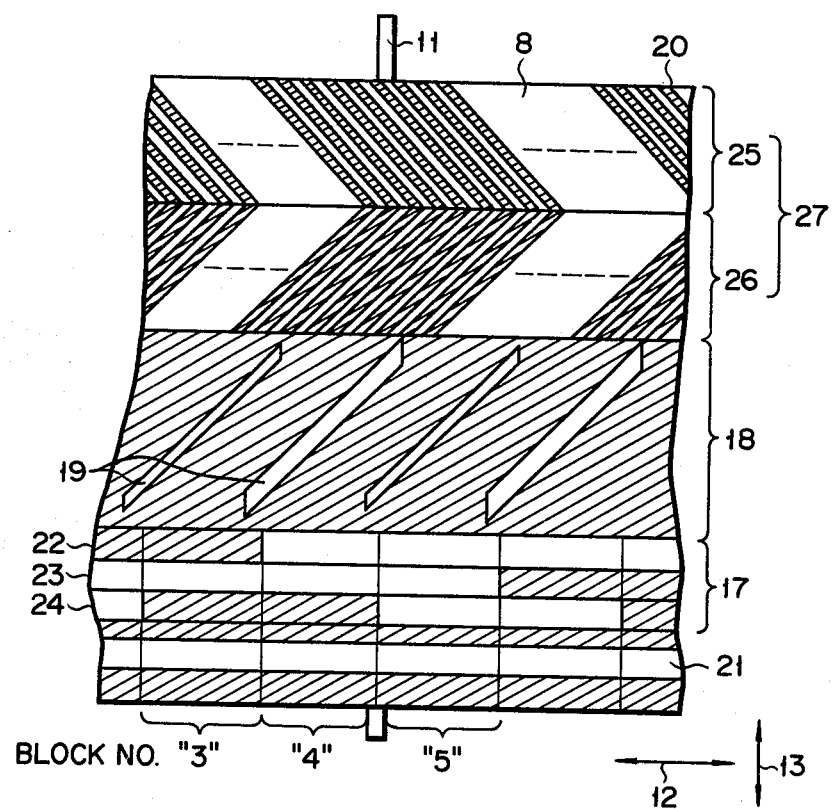

An embodiment of a code plate for an encoder according to the present invention will be described with reference to FIGS. 5 and 6. FIG. 5(a) shows patterns of a code plate for an encoder of high precision and resolution wherein the code plate 8 is divided into a plurality of blocks, the number of each block is read with the address track 17, inside each block is interpolated by the fine reading patterns 19, and inside this fine reading pattern 19 is further interpolated by an inclined lattice 20. The patterns of the code plate 8 comprise, as shown in the figure, a reference track 21, an address track 17, a fine track 18, and an inclined lattice track 27 and are related to the sensor array 11 as an shown in the figure. The reference track 21 shows the reference position of the entire patterns, designates the element of the sensor array for the purpose of reading the address, and indicates the reference position of the fine reading patterns 19. The address track 17 has a plurality of further divided tracks 22, 23 and 24 and gray codes are arranged in these further divided tracks for each block divided in the direction indicated by 12. The fine reading track 18 includes patterns which vary in the perpendicular direction when the code plate 8 and the sensor array 11 move relative to each other in the direction indicated by 12. These patterns are slightly longer than each block and are capable of distinguishing adjacent blocks. Although these patterns may be distinguished by thickness as in the figure, they may alternatively be distinguished by the number or transmittance. The inclined lattice track 27 has patterns shown in FIG. 4(a) and function as has been described hereinbefore. For example, it is assumed that the inclination of the fine reading patterns and the inclined lattice patterns with respect to the sensor array is 45°, the pitch of the sensor array is 10 $\mu$m, and the vernier relationship between the sensor array and the inclined lattice patterns in 10 : 11. In this case, the pitch of the inclined lattice patterns of the sensor array becomes 22 $\mu$m, and the position of the intersection of the output of the sensor array moves by a distance corresponding to one element of the sensor array upon a relative displacement of 1 μm. Describing the relative displacement between the code plate and the sensor array only with reference to the displacement in the direction indicated by 12 for the purpose of simplicity, the distance between the intersections of the outputs of the sensor array obtained with the inclined lattice patterns 25 and 26 move by a distance corresponding to two elements upon relative displacement of 1 μm. Therefore, a resolution of 0.5 μm may be obtained by interpolating to the unit of one element. Therefore, by reading the position of the block with the address track, reading with the unit of one pitch (10 μm) of the sensor array with the fine reading patterns, and interpolating with the inclined lattice pattern track, an encoder capable of providing a resolution of 0.5 μm may be realized. The interpolation within the unit of one element of the sensor array may be accomplished by detecting the positions of the intersections of the sensor array outputs obtained with the inclined lattice patterns by, for example, approximating the outputs of the odd- and even-numbered elements with the respective frequencies and calculating their intersections.

The displacement in the direction indicated by 13 may similarly be detected with high precision by detecting the position of the reference track 21 projected on the sensor array and also detecting the midpoint of the intersections of the sensor array outputs with the inclined lattice patterns 25 and 26.

Figure 5B:
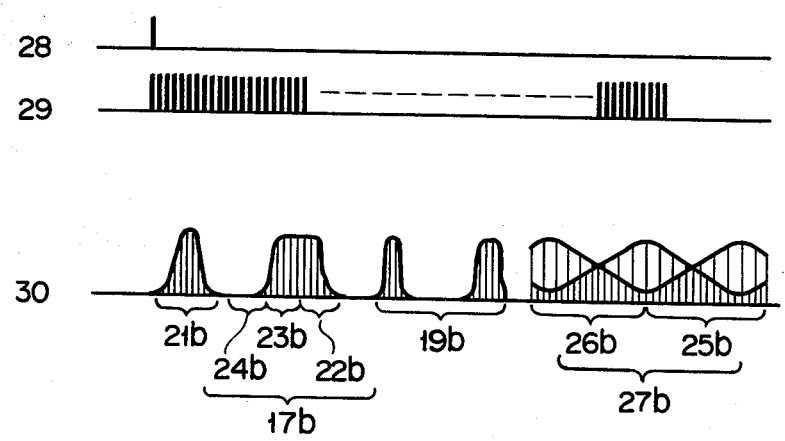

FIG. 5(b) shows the input and output signals of the line sensor according to the arrangement shown in FIG. 5(a) wherein reference numeral 28 denotes a start pulse, 29 denotes a clock pulse, and 30 denotes an output signal proportional to the intensity of light.

Figure 6:
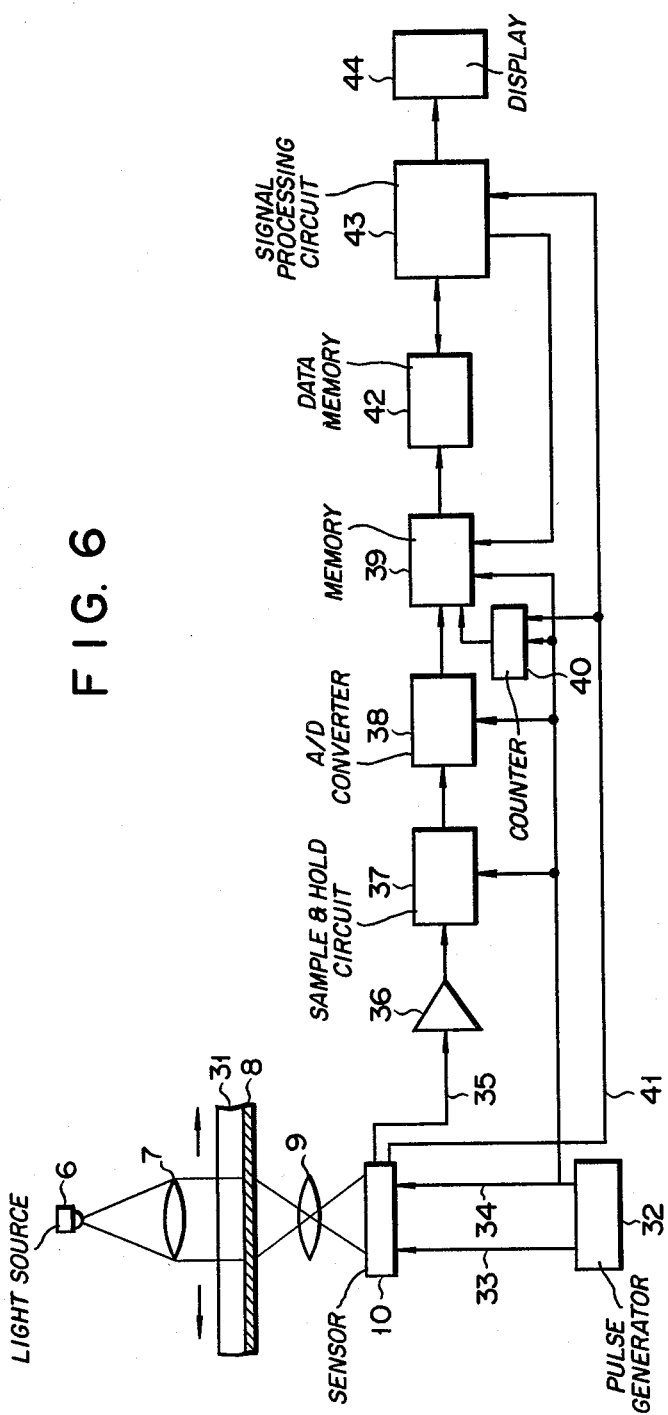
FIG. 6 is a block diagram of a signal processing circuit according to the first embodiment of the present invention.

FIG. 6 is an overall block diagram of an encoder according to the present invention. The mode of operation of this encoder will now be described with reference to FIGS. 5 and 6.

The code plate 8 mounted to a moving object 31 such as a table of a machine tool or the like is illuminated by the light source 6 through the illumination lens 7, and an image of the transmitted pattern is formed on the line sensor 10 by the projection lens 9. In response to a scanning start pulse 33 from a pulse generator 32, the line sensor 10 starts scanning, and supplies an output signal 35 to an amplifier 36 in synchronism with a clock pulse 34 output from the same pulse generator 32. The signals passed through the amplifier 36 are supplied to a sample and hold circuit 37 which holds the peak value of the output of each element as an analog voltage which is converted into a digital signal by an analog-to-digital converter 38.

A digital memory 39 sequentially stores the A/D converted outputs of the line sensor 10. If the digital memory 39 comprises a random access memory, the outputs of the line sensor are sequentially stored from the zero address of the memory by designating the addresses of the memory by the output of a counter 40 which counts the clock pulses output in synchronism with the outputs of the line sensor. The addresses of the memory and the bit numbers of the line sensor thus establish a one-to-one correspondence. The counter 40 must be reset in advance by the scanning start pulse 33 or a scanning terminating pulse 41. A signal processing circuit 43 comprises, for example, a microprocessor. In response to the scanning terminating pulse 41 of the line sensor, the signal processing circuit 43 transfers the line sensor output data temporarily stored in the digital memory 39 to a data memory 42 under its control and starts processing the data. The operation of the signal processing circuit 43 includes the following:

(1) To determine a central position 21b of the output of the line sensor with the reference track 21.

(2) To determine the number of elements of the sensor array of the line sensor on which are projected further divided tracks 22, 23 and 24 and to read the addresses by performing reading from line sensor outputs 22b, 23b and 24b.

(3) To determine the central position of the fine reading pattern 19 from a line sensor output 19b of the fine reading pattern 19, and to judge whether this fine reading pattern 19 is a thick pattern or a thin pattern.

(4) To compute the fine reading value from a distance between the central position of the fine reading pattern 19 to the central position of the reference track 21.

(5) To correct the fine reading value obtained with the address with the address track 17.

(6) To compute the position of the intersection of the output of an even-numbered element from the sensor array output 26b obtained with the inclined lattice pattern 26 with the output of an odd-numbered element.

(7) To compute the position of the intersection of the output of an even-numbered element from the sensor output 25b obtained with the inclined lattice pattern 25 with the output of an odd-numbered element.

(8) To obtain a distance between the intersections computed in items (6) and (7) above and to obtain an interpolated value of the fine reading value obtained in item (4) above.

(9) To correct the results obtained in items (8) and (5).

Detection of the displacement in the direction indicated by 12 of FIG. 5(a) is thus completed.

(10) To compute the central position of the intersections obtained in items (6) and (7) and to obtain an interpolated value of the displacement in the direction indicated by 13.

(11) To obtain a distance between the position of the reference bit freely set on the sensor array with the central position of the reference track detected in item (1) above, and to correct the obtained value with the result obtained in item (10). The detection of the displacement from the freely set reference position in the direction indicated by 13 in FIG. 5(a) is completed.

(12) To convert the computed result obtained in items (9) and (11) into an actual measurement and to display it at a display 44.

The position in the direction of normal displacement and the position in the direction perpendicular thereto are thus displayed at the display 44.

The correction described above is performed in the manner to be described below. When the line sensor is at the boundary between the blocks as in FIG. 5(a), the reading is determined according to the fine reading in the following manner:

(a) When a thick pattern is located above a thin pattern, if the read address is an even number, this address is added to the fine reading obtained with the thick pattern. If on the other hand, the read address is an odd number, 1 is subtracted from it, and the fine reading obtained with the thick pattern is added to the subtraction result.

(b) When a thin pattern is located above a thick pattern, if the read address is an odd number, the address and the fine reading obtained with the thin reading are added. If the read address is an even number, 1 is subtracted from it, and the fine reading obtained with the thin pattern is added to the subtraction result.

This correction is performed between the fine reading value and the address. Similarly, correction must be performed between the interpolated value obtained with the inclined lattice pattern and the fine reading. However, as has already been described, if the range of reading with the lower significant digit (fine reading) is wider than the resolution of the upper significant digit (address), the correction may be easily performed. In a similar manner, the correction between the interpolated value obtained with the inclined lattice patterns with the fine reading obtained with the fine reading patterns may be easily performed by making the range of the interpolated value wider than the resolution of the fine reading obtained with the fine reading patterns. Thus, for performing the reading with the unit of one pitch of the sensor array with the fine reading pattern, it suffices to interpolate within one period of the code plate by detecting the intersections obtained with the inclined lattice patterns while also considering the phase relation between the outputs of the even-numbered elements and the outputs of the odd-numbered elements. For performing the reading to the unit of ½ the pitch of the sensor array with the fine reading patterns, ½ the period of the code plate may be interpolated while considering only the positions of the intersections.

For detecting the central positions of the reference track and the fine reading tracks in items (1) and (3), the midpoint of a segment connecting points at which the leading and trailing edges of the output are half the peak value may be obtained. Alternatively, the output waveform may be approximated by a polynominal and the maximum value may be obtained. The central positons may be detected with resolution significantly smaller than the pitch of the sensor array.

In the embodiment described above, the change in the optical system for projecting the pattern of the code plate on the sensor array, for example, a change in the magnification of the projecting lens as designated by 9 in FIG. 6 is included in the measurement as errors. For example, when the pattern designed for a magnification of 1 : 1 is projected on the sensor array with a different magnification due to errors introduced by the focal distance of the projecting lens or errors in setting the code plate, the projecting lens, and the sensor array, errors are included in the reading. For this reason, high precision may not be achieved unless control of the focal distance of the projecting optical system and the adjustment during assembly are performed under strict control.

Figure 7:
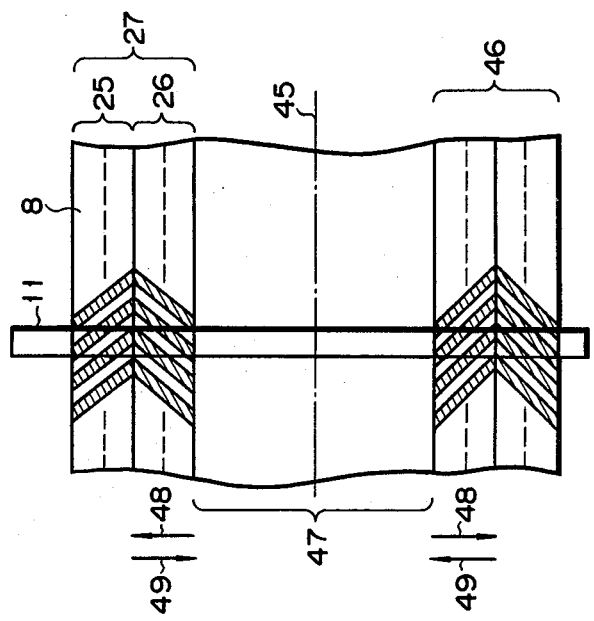
FIG. 7 is a view illustrating a modification of the patterns of a code plate according to another embodiment of the present invention.

FIG. 7 shows an example of patterns of the code plate according to a further embodiment of the present invention which is modified to solve these problems and which realizes high precision without requiring such strict control of magnification.

Referring to FIG. 7, another inclined lattice track 46 for correction of magnification of similar structure is arranged symmetrically with the inclined lattice track 27 already described above about an optical axis 45 (or optical center) of the projecting optical system. At part 47, the reference track, the address track and the fine reading track are arranged in the same manner as in FIG. 5(a), these parts being omitted for the sake of simplicity.

When the optical projecting magnification changes, the patterns of the code plate projected on the sensor array are displaced symmetrically about the optical axis.

When it is assumed that the sensor array 11 and the code plate 8 are arranged in the manner as shown in the figure and the patterns of the code plate are projected on a reduced scale due to a change in the projecting magnification, the positions of the intersections of the sensor array outputs move to the direction indicated by 49 the same distance, respectively. When the patterns are projected on an enlarged scale, the intersections of the sensor array move in the direction indicated by 48 and the distance of their movement is proportional to the rate of change of the projecting magnification. Thus, the midpoint of the intersections of the sensor array outputs obtained with the inclined lattice pattern 25 and the inclined lattice pattern 26 is detected as the projected position of the inclined lattice track 27 on the sensor array. Similarly, the projected position of the inclined lattice track 46 on the sensor array is detected. Then, a deviation from a reference set distance (e.g., when the projecting magnification is 1 : 1) indicates the change of the projecting magnification. Therefore, an encoder may be manufactured which is not affected by the change in the projecting magnification by correcting the reading according to the deviation thus obtained.

The above description has been made with reference to a case for detecting the change in the magnification with the track for interpolation. However, where it is expected that the rate of change of the magnification exceeds the range of interpolation, the range of correction may be widened by arranging the reference track and the fine reading track symmetrically about the optical axis of the projecting optical system.

Figure 8:
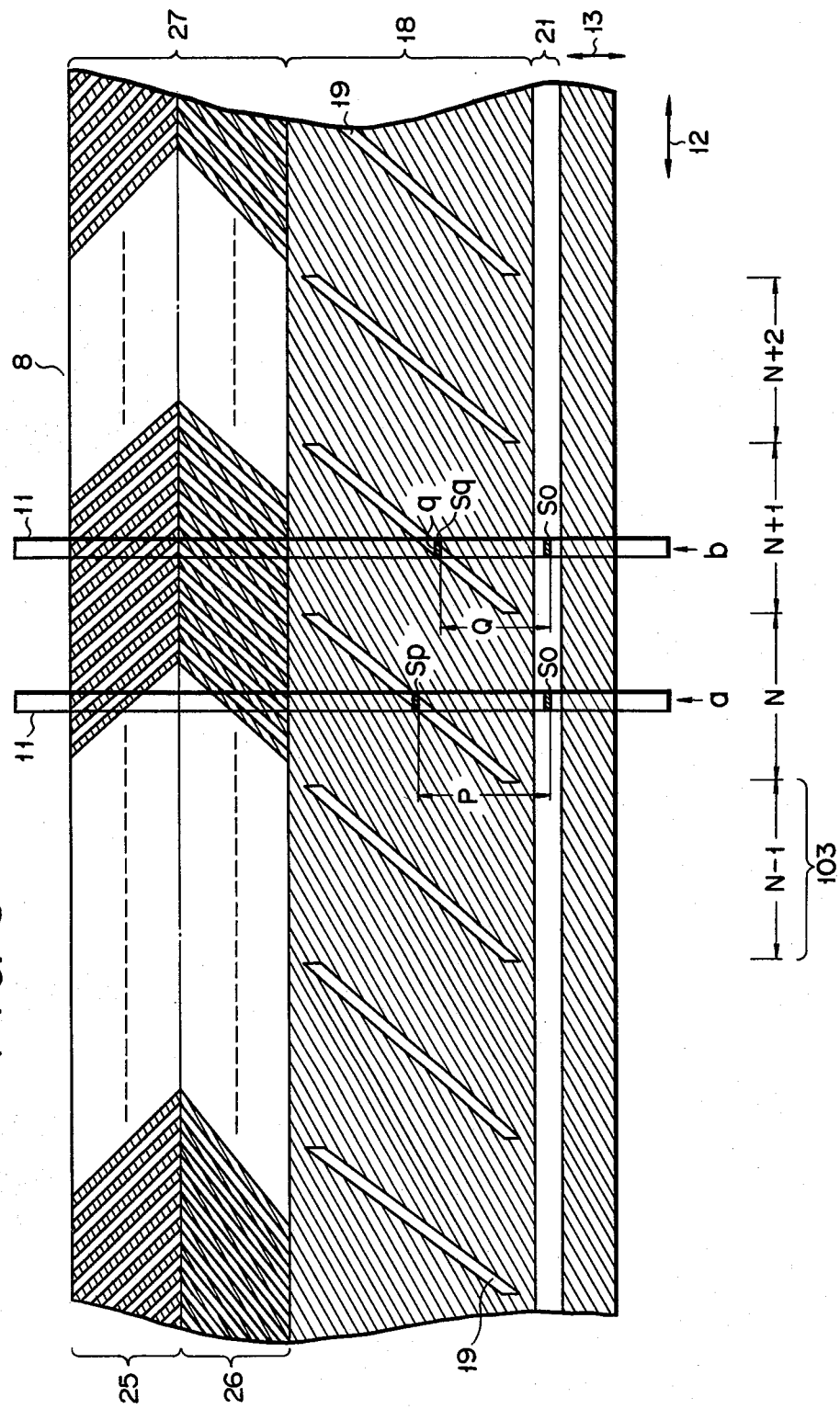
FIG. 8 is a view showing in detail the patterns of a code plate according to still another embodiment of the present invention.

FIG. 8 shows an encoder for incrementally measuring lengths or angles according to a further embodiment of the present invention. Referring to FIG. 8, a plurality of blocks N−1, N, N+1, . . . are formed in the code plate 8, and each block 103 (N−1) has the reference track 21, the fine reading track 18, and the inclined lattice track 27 which have been described hereinbefore. Fine reading patterns 19 of the fine reading track 18 may comprise lines of the same thickness unlike in the case of the embodiments described above. The sensor array 11 is arranged in the direction perpendicular to the direction of normal displacement of the code plate 8 relative to the sensor array 11. The driver for driving this encoder is of the same construction as that of the embodiment described above. However, the measuring procedure is as follows. The measuring procedure described below is for measuring the displacement in the direction indicated by 12.

(1) To determine the central position of the reference track from the sensor output obtained with the reference track 21.

For example, when the sensor array 11 is at position a in FIG. 8, the central position of the reference track is determined to be at the position of a sensor element SO.

(2) To designate a sensor element Sp for incremental counting which is spaced apart by a predetermined distance P from the sensor element SO corresponding to the central position of the reference track obtained in item (1).

(3) To count the number of times the sensor element Sp for incremental counting has detected the fine reading patterns 19 by a counting means of the signal processing circuit 44 (FIG. 6) in order to measure with the unit of blocks a distance from the predetermined zero point of the code plate 8 to a measuring point. For example, in FIG. 8, the element Sp counts the Nth block.

(4) The determine the central position of the fine reading pattern 19. The fine reading within the block is computed from the resultant central position and the central position of the reference track 21. For example, when the sensor array 6 is at position 6 in FIG. 8, the fine reading within the (N+1)th block may be computed from a distance Q between a sensor element Sq corresponding to the central position q of the fine reading pattern 19 and a sensor element SO′ corresponding to the central position of the reference track 21. It is to be noted that the count with the unit of blocks in item (3) is N+1.

(5) To compute the position of the intersection of the output of the even-numbered elements and the output of the odd-numbered element with the inclined lattice pattern 26.

(6) To compute the position of the intersection of the output of the even-numbered elements and the output of the odd-numbered elements with the inclined lattice pattern 25.

(7) To obtain a distance between the intersections obtained in items (5) and (6) and to obtain an interpolated value of the fine reading obtained in item (4).

(8) To add the block count, the fine reading and the interpolated value obtained in items (3), (4) and (7), respectively, to obtain a measurement.

In the embodiment described above, a particular sensor array element located at a certain distance from the central position of the reference track is used as a sensor element for incremental counting. Block counting is performed by counting the fine reading patterns with this sensor element. However, a detecting element separate from the elements of the sensor array may be incorporated for counting the fine reading patterns for the purpose of counting the blocks.

The encoder of the present invention of the construction as described above has the advantages to be described below:

(1) An encoder of high resolution and precision may be obtained by establishing a vernier relationship between the inclined lattice patterns and the sensor array.

(2) Since the line sensor is used, the electrical system is simple.

(3) With the incorporation of a set of inclined lattice patterns in the code plate, displacement of the sensor array in two directions, i.e., in the longitudinal direction and in the direction perpendicular thereto, may be independently detected upon two-dimensional displacement of the code plate relative to the sensor array. Furthermore, by arranging a plurality of inclined lattice patterns symmetrically with each other, correction of the errors introduced by the change in the magnification of the optical system for projecting the patterns of the code plate on the line sensor.

(4) Since the reference track is incorporated and the position of the address track is determined with reference to this reference track, a greater relative displacement in the perpendicular direction may be allowed. This is advantageous for manufacture, installation, and maintenance. Since the width of the divided tracks of the address track may be made small, the number of sensor array elements of the sensor array for reading the addresses may be reduced to the minimum so that the manufacturing cost may be reduced. The extra elements may be utilized, if desired, for increased redundancy, thereby improving the reliability.

(5) The measurement of lengths in the perpendicular direction may also be performed with high resolution and precision from the inclined lattice patterns and the distance between a particular point freely set on the sensor array and the central position of the reference track.

(6) Even when reading with high precision with the fine reading track is impossible due to a high speed displacement, reading within an accuracy of one block unit of the address track is still possible. This is an essential condition when the encoder is used for a machine tool or the like.

Although the code plate and the line sensor have been described as linearly displacing in the above embodiments, a rotary encoder may also be realized by utilizing, for example, a ring-shaped code plate. In this cases if one block consists of sufficiently small angle, the fine reading patterns and the inclined lattice patterns may be linear. However, for higher precision, the fine reading patterns and the inclined lattice patterns may conveniently comprise Archimedes' spirals defined by relation of $r=a\theta$ (a: constant) where $\theta$, an angle and r, a radius are in linear relationship with each other and is disclosed, for instance, in U.S. Pat. No. 4,253,021. It is to be noted that the interpolation precision, that is, the minimum measuring precision of an encoder of the present invention may be varied by changing projecting magnification of the projecting lens 9 shown in FIG. 2.

Furthermore, the relative positions of the code plate and the line sensor are measured in the above embodiments. However, the patterns of the code plate may be reflected with a reflector or the like while holding stationary the code plate and the line sensor, and the displacement of the reflector may be measured. The reflected image may be used instead of the transmitted image of the code plate. The reading with the unit of the pitch of the sensor array may be performed only with the address track without utilizing the fine reading patterns. Although the number of further divided tracks within the address track may increase depending upon the length of the code plate or the angular divisor thereof, this may not necessarily result in a disadvantage since line sensors which have sufficient number of elements and which are inexpensive are readily available today.

What we claim is:

1. An interpolation encoder comprising a sensor array having a plurality of sensor elements continuously arranged in an array, a code plate which has periodic lattice patterns including lattice pattern information "1" and "0" alternately and which is arranged in opposition to said sensor array, and an arithmetic unit for processing data detected by said sensor array from said lattice patterns of said code plate, characterized in that;

said lattice patterns are formed by inclined lattice patterns whose arrangement is inclined with respect to the arrangement of said sensor elements of said sensor array for providing detection sensitivity in two-dimensions for said sensor array, whereby the number of the lattice patterns within a predetermined length of said code plate is slightly different from the number of said sensor elements of said sensor array within a length corresponding to said predetermined length so that a vernier relationship is established between the lattice patterns of said code plate and said sensor array, and said arithemtic unit is provided with means for obtaining an intersected position of an output envelope of even-numbered elements and an output envelope of odd-numbered elements of said sensor array for obtaining an interpolated value within the width of the sensor element.

2. An interpolation encoder according to claim 1, characterized in that said code plate has a plurality of said groups of lattice patterns, and said lattice patterns of at least one of said groups of lattice patterns comprise said inclined lattice patterns.

3. An interpolation encoder according to claim 2, characterized in that said lattice patterns of at least one of said plurality of groups of lattice patterns comprise other inclined lattice patterns symmetrical with said inclined lattice patterns.

4. An interpolation encoder according to claim 1, characterized in that said inclined lattice patterns comprise line patterns.

5. An interpolation encoder according to claim 1, characterized in that said inclined lattice patterns comprise patterns of Archimedes' spirals.

6. An encoder for measuring a two-dimensional displacement which comprises a code plate having a plurality of blocks, each of said blocks having address data representing an address of said block and having interpolation patterns comprising periodic lattice patterns including lattice pattern information "1" and "0" alternately, a sensor array having a plurality of sensor elements continuously arranged in an array, and an arithmetic unit for processing data detected by said sensor array from said code plate, characterized in that;

said lattice patterns are formed by lattice patterns whose arrangement is inclined with respect to the arrangement of said sensor elements of said sensor array, whereby the number of lattice patterns within a predetermined length of said code plate is slightly different from the number of said sensor elements of said sensor array within a length corresponding to said predetermined length so that a vernier relationship is established between the lattice patterns of said code plate and said sensor array, and said arithmetic unit is provided with means for obtaining an intersected position of an output envelope of even-numbered elements and an output envelope of odd-numbered elements of said sensor array for obtaining an interpolated value within the width of the sensor element, whereby the displacement of said code plate in the longitudinal direction of said sensor array and in the direction perpendicular thereto can be detected independently with high precision.

7. An encoder according to claim 6, characterized in that said code plate is moved in one normal direction of displacement to be measured, and said arithmetic unit has a means for cancelling errors in the direction perpendicular to the direction of said normal displacement to be measured.

8. An encoder according to one of claim 6 or 7, characterized in that said blocks of said code plate respectively have fine reading patterns comprising line patterns inclined with respect to said sensor array for indicating fine displacements within each of said blocks.

9. An encoder according to claim 8 characterized in that said fine reading patterns are different in thickness, number, or transmittance from one to another.

10. An encoder according to one of claims 6 and 7, characterized in that said fine reading patterns comprise Archimedes' spirals.

11. An encoder according to claim 10, characterized in that said interpolation patterns comprise at least one track having a plurality of Archimedes' spirals.

12. An encoder according to one of claims 6 and 7, characterized in that said interpolation patterns are inclined with respect to said sensor array and comprise at least one track having a plurality of parallel lines.

13. An encoder according to claim 12, characterized in that said track consists of two tracks, at least one of which is inclined to said sensor array and has a line patterns consisting of a plurality of parallel lines.

14. An encoder according to claim 12, characterized in that at least two said tracks are incorporated, and at least one of said tracks has line patterns symmetrical with said line patterns of the other of said tracks.

15. An encoder according to claim 6 or 7, characterized in that said address data comprise gray codes.

16. An encoder according to claim 6 or 7, characterized in that said blocks relatively has a reference track for designating a reading start bit of said sensor array.

17. An encoder according to claim 6 or 7, characterized in that said code plate comprises an optical code plate, said sensor array comprise a group of photoelectric converting elements, a projecting optical system is interposed between said code plate and said sensor array, and said interpolation patterns and/or said fine reading patterns are formed symmetrically with each other about a plane including an optical axis of said projecting optical systems.

18. An incremental encoder for measuring a two-dimensional displacement which comprises a code plate having interpolation patterns comprising periodic lattice patterns including lattice pattern information "1" and "0" alternately, a sensor array having a plurality of sensor elements continuously arranged in an array, and an arithmetic unit for processing data detected by said sensor array from said code plate, characterized in that;

said code plate has a reference pattern, fine reading patterns, and interpolation patterns, the arrangements of said fine reading patterns and said interpolation patterns respectively are inclined with respect to an arrangement of said sensor elements of said sensor array, said lattice patterns are formed by lattice patterns whose arrangement is inclined with respect to the arrangement of said sensor elements of said sensor array, whereby the number of lattice predetermined length of said code plate is slightly different from the number of said sensor elements of said sensor array within a length corresponding to said predetermined length so that a vernier relationship is established between the lattice patterns of said code plate and said sensor array, and said arithmetic unit is provided with means for obtaining an intersected position of an output envelope of even-numbered elements and an output envelope of odd-numbered elements of said sensor array for obtaining an interpolated value within the width of the sensor element, so that displacement of said code plate in the longitudinal direction of said sensor array and in the direction perpendiculr thereto may be detected independently with high precision.

19. An incremetal encoder according to claim 18, characterized in that said code plate is moved in one normal direction of a displacement to be measured, and said arithmetic unit has a means for cancelling errors in the direction perpendicular to the direction of said normal displacement to be measured.

20. An encoder according to claim 18 or 19, characterized in that said fine reading patterns and said interpolation patterns comprise line patterns, and said interpolation patterns comprise at least two inclined lattice patterns which are symmetrically oriented with each other.

21. An encoder according to claim 18 or 19, characterized in that said reference pattern comprises line patterns parallel to said direction of displacement of said code plate.

* * * * *